US009768045B2

(12) United States Patent
Matsutori et al.

(10) Patent No.: US 9,768,045 B2
(45) Date of Patent: Sep. 19, 2017

(54) SUBSTRATE STORING CONTAINER

(71) Applicants: MIRAIAL CO., LTD., Tokyo (JP); SHIN-ETSU POLYMER CO., LTD., Tokyo (JP)

(72) Inventors: Chiaki Matsutori, Tokyo (JP); Tsuyoshi Nagashima, Tokyo (JP); Takaharu Oyama, Tokyo (JP); Shuichi Inoue, Tokyo (JP); Hiroyuki Shida, Saitama (JP); Hiroki Yamagishi, Saitama (JP); Kazumasa Ohnuki, Saitama (JP)

(73) Assignees: MIRAIAL CO., LTD., Tokyo (JP); SHIN-ETSU POLYMER CO., LTD., Tokyo (JP)

( * ) Notice: Subject to any disclaimer, the term of this patent is extended or adjusted under 35 U.S.C. 154(b) by 0 days.

(21) Appl. No.: 14/443,972

(22) PCT Filed: Nov. 20, 2012

(86) PCT No.: PCT/JP2012/080076
§ 371 (c)(1),
(2) Date: May 19, 2015

(87) PCT Pub. No.: WO2014/080454
PCT Pub. Date: May 30, 2014

(65) Prior Publication Data
US 2015/0294882 A1    Oct. 15, 2015

(51) Int. Cl.
*B65D 85/30* (2006.01)
*H01L 21/673* (2006.01)

(52) U.S. Cl.
CPC .... *H01L 21/6732* (2013.01); *H01L 21/67369* (2013.01); *H01L 21/67376* (2013.01);
(Continued)

(58) Field of Classification Search
CPC ............ H01L 21/6732; H01L 21/6735; H01L 21/67383; H01L 21/67303; B65D 2585/86; B65D 85/30; B65D 85/48; Y10S 206/832
See application file for complete search history.

(56) References Cited

U.S. PATENT DOCUMENTS 8,318,275 B2 * 11/2012 Kudo .................. B29C 45/1657
206/454
8,910,792 B2 * 12/2014 Nagashima ....... H01L 21/67369
206/454
(Continued)

FOREIGN PATENT DOCUMENTS

JP         2005-5525 A      1/2005
JP       2006-324327 A     11/2006
(Continued)

*Primary Examiner* — Anthony Stashick
*Assistant Examiner* — Mollie Impink
(74) *Attorney, Agent, or Firm* — Muncy, Geissler, Olds & Lowe, P.C.

(57) ABSTRACT

The lid body side wafer support parts allow flexibility to be exhibited and supports the wafers. If a closed state substrate is defined as being a wafer which is stored in the substrate storing space in a container main body in a state wherein the container main body opening portion is closed by the lid body, and a closed time center is defined as being the center of a closed state substrate, the back side substrate support portion, when a closed state substrate is viewed in the thickness direction, are disposed in a pair about a depth direction reference line and support the wafer. A center angle which the back side substrate support portion form toward the depth direction with respect to a left/right direction reference line when a closed state substrate is viewed in the thickness direction is 20-55°.

4 Claims, 8 Drawing Sheets

(52) U.S. Cl.
CPC ........ *H01L 21/67383* (2013.01); *B65D 85/30* (2013.01); *B65D 2585/86* (2013.01)

(56) References Cited

U.S. PATENT DOCUMENTS

| | | | |
|---|---|---|---|
| 2005/0274645 A1* | 12/2005 | Hasegawa | H01L 21/67369 206/710 |
| 2006/0283774 A1 | 12/2006 | Hasegawa et al. | |
| 2011/0005967 A1* | 1/2011 | Gregerson | H01L 21/67383 206/711 |
| 2013/0037444 A1 | 2/2013 | Inoue | |
| 2013/0056388 A1 | 3/2013 | Nagashima | |

FOREIGN PATENT DOCUMENTS

| | | | |
|---|---|---|---|
| JP | 2011-108715 A | 6/2011 | |
| JP | 2011-253960 A | 12/2011 | |
| WO | WO2009/089552 A2 * | 7/2009 | ........... H01L 21/673 |
| WO | WO 2011/132257 A1 | 10/2011 | |
| WO | WO 2011/148450 A1 | 12/2011 | |

\* cited by examiner

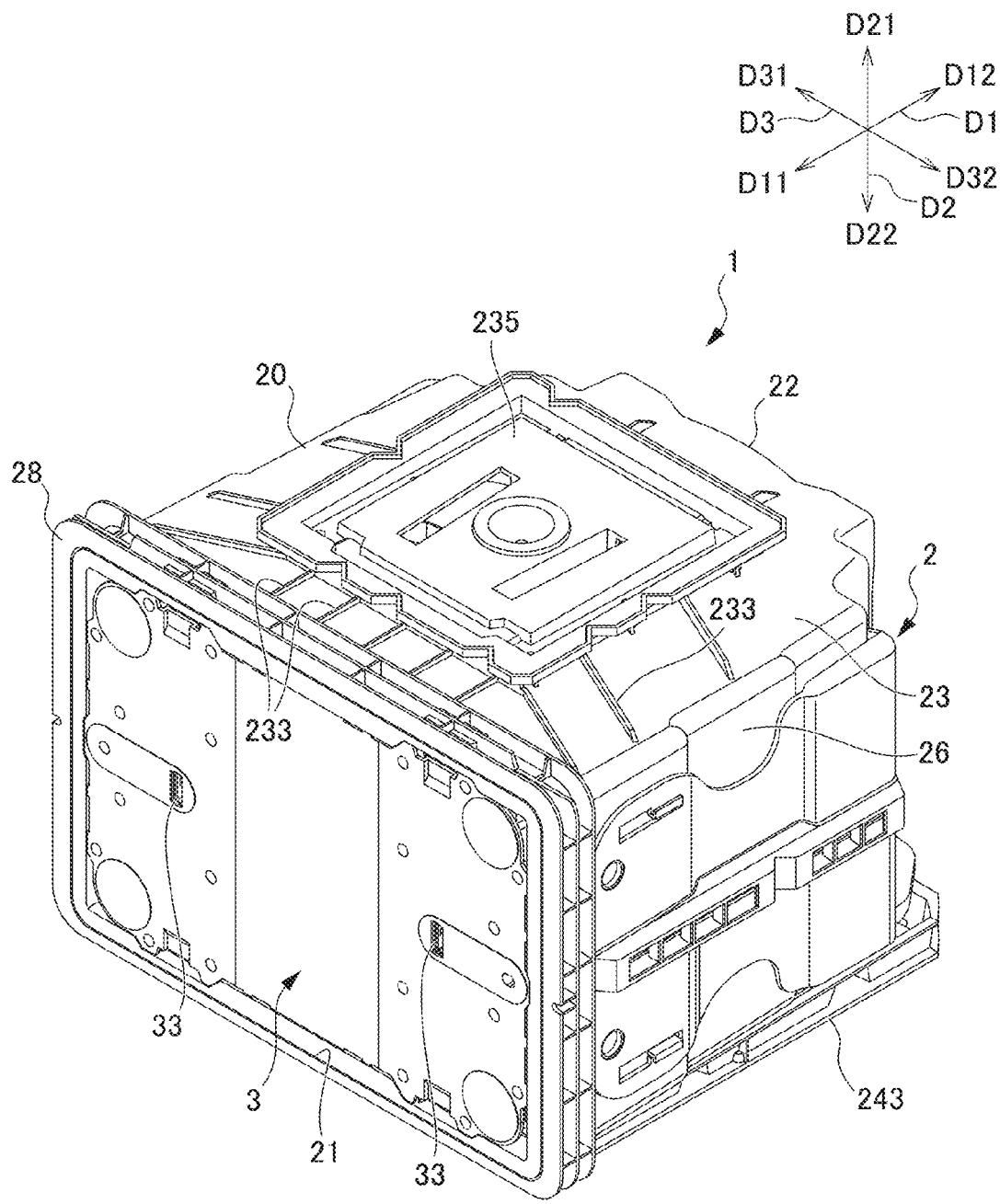

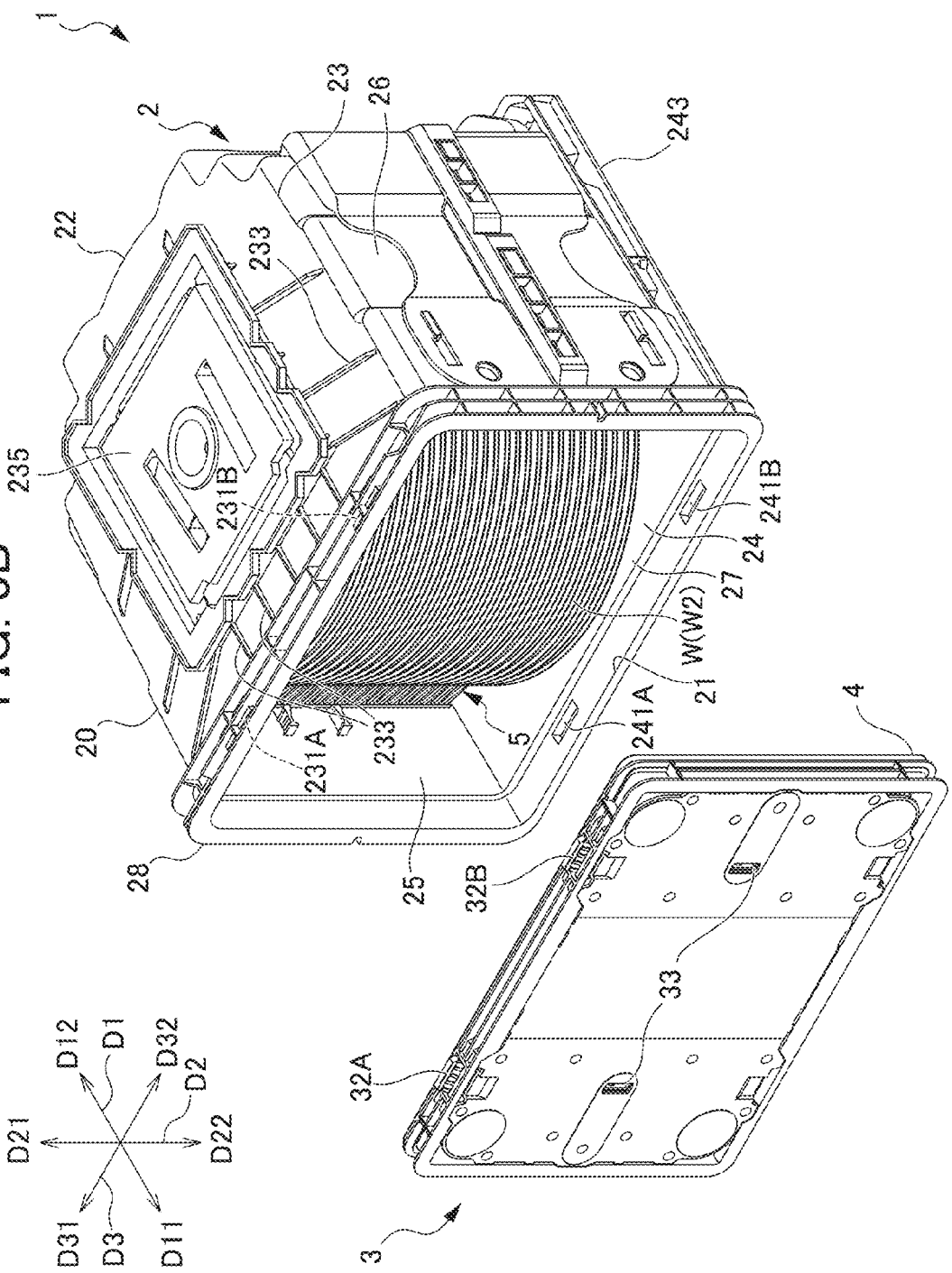

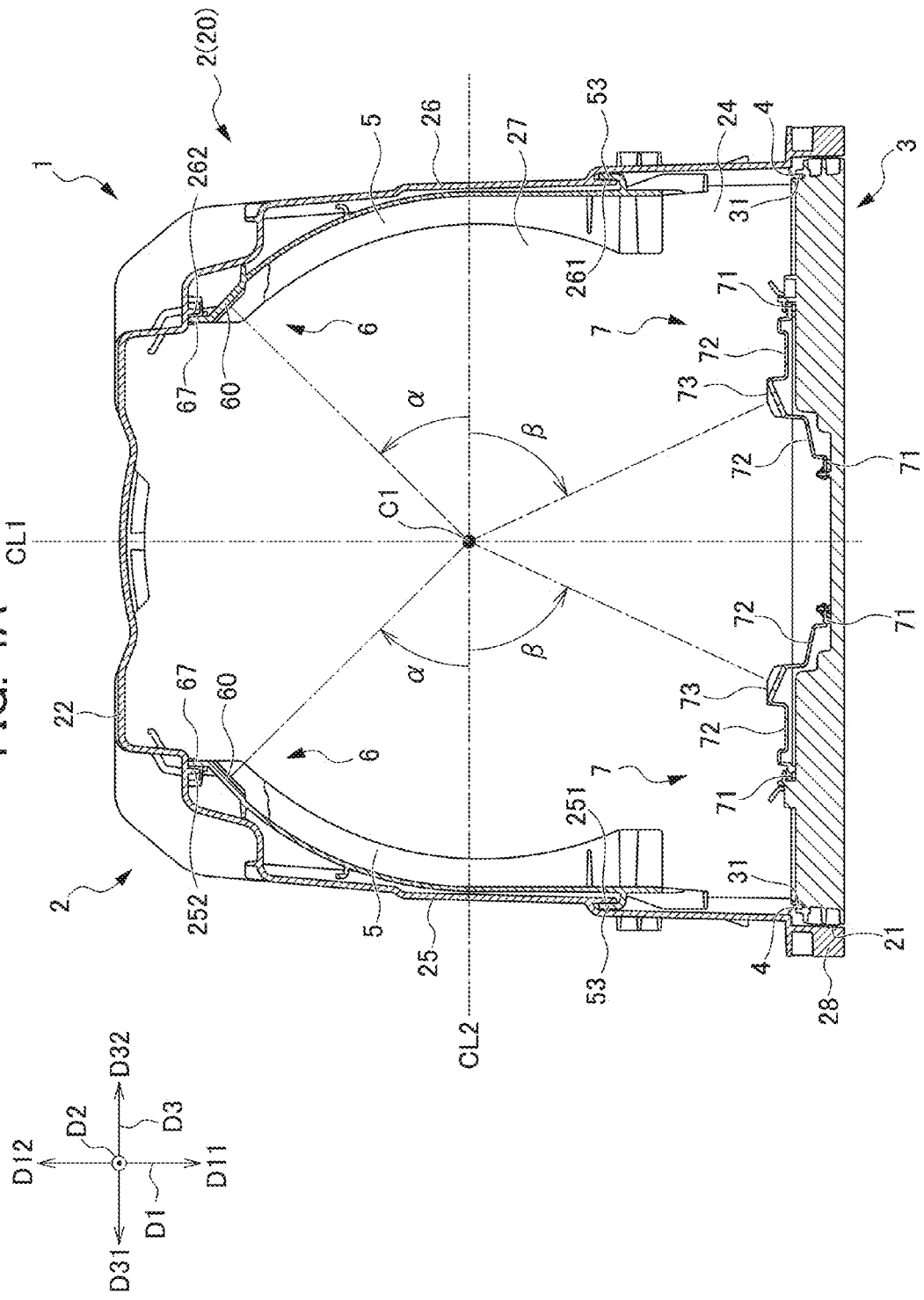

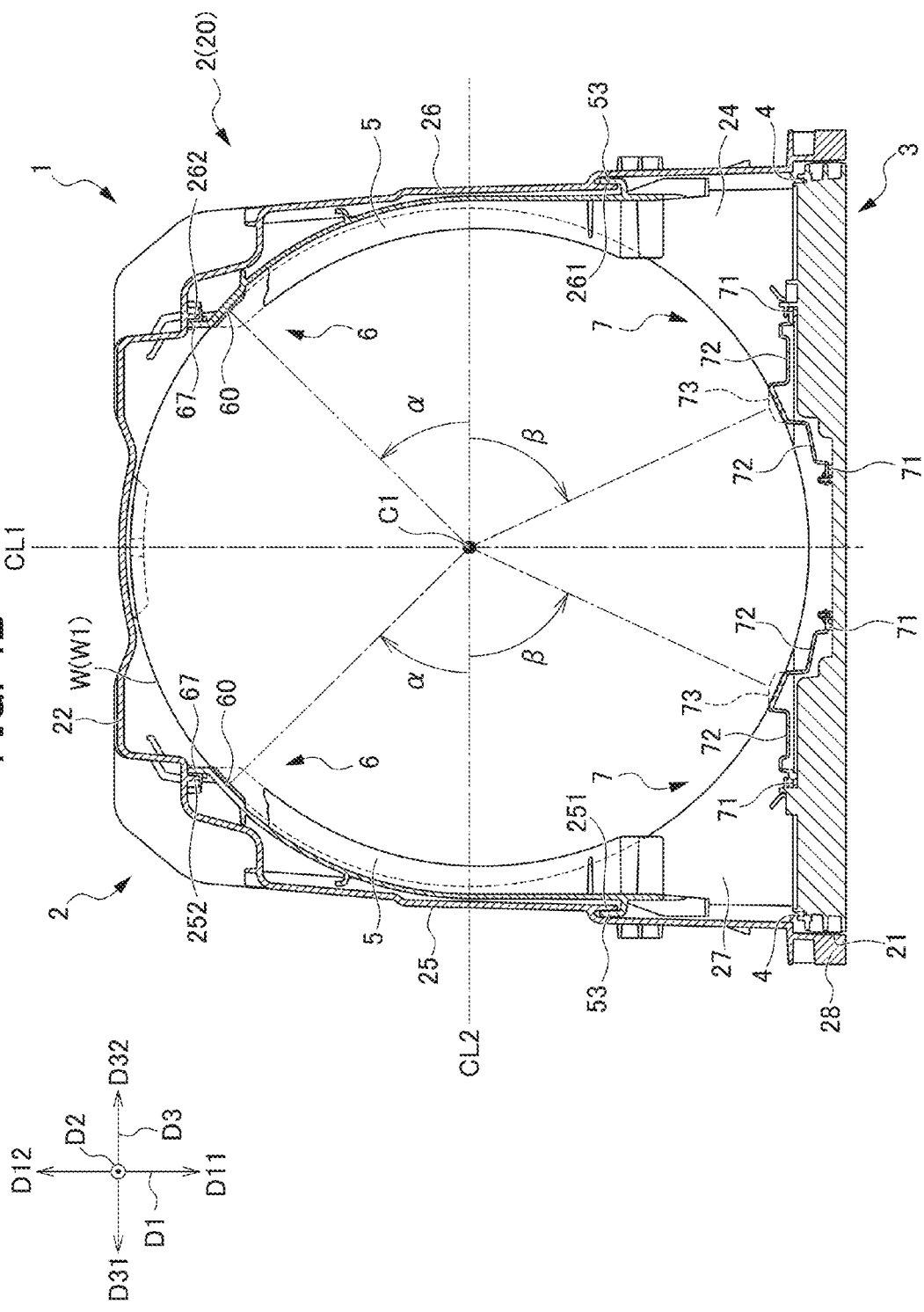

SUBSTRATE STORING CONTAINER

TECHNICAL FIELD

The present invention relates to a substrate storing container. More specifically, the present invention relates to a substrate storing container that stores a plurality of substrates such as semiconductor wafers, etc., in a state arranged in parallel.

BACKGROUND ART

As a container that stores substrates such as semiconductor wafers, one has been known conventionally that has a configuration including a container main body, a lid body, a lateral substrate support portion, a lid body side substrate support portion, and a back side substrate support portion.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates. The lid body can be removably attached to the container main body opening portion and can close the container main body opening portion. Lateral substrate support portions are provided at the wall portion so as to form a pair in the substrate storing space. When the container main body opening portion is not closed by the lid body, the lateral substrate support portions can support edge portions of a plurality of substrates in a state in which adjacent substrates are arranged in parallel to be spaced by a predetermined interval.

The lid body side substrate support portion is provided to a part of the lid body at a portion which faces a substrate storing space when the container main body opening portion is closed. When the container main body opening portion is closed by the lid body, the lid body side substrate support portion can support edge portions of the plurality of substrates.

The back side substrate support portion is provided at the wall portion so as to form a pair with the lid body side substrate support portion. The back side substrate support portion can support edge portions of a plurality of substrates. When the container main body opening portion is closed by the lid body, the back side substrate support portion retains a plurality of substrates in a state in which adjacent substrates are arranged in parallel to be spaced apart by a predetermined interval, by supporting the plurality of substrates in cooperation with the lid body side substrate support portion (refer to Japanese Unexamined Patent Application, Publication No. 2011-108715).

It should be noted that the back side substrate support portion may be formed integrally formed with a lateral substrate support portion, or may be configured so as to be separate from the lateral substrate support portion.

Patent Document 1: Japanese Unexamined Patent Application, Publication No. 2011-108715

DISCLOSURE OF THE INVENTION

Problems to be Solved by the Invention

While transporting a substrate storing container in which substrates are contained, impacts received from the outside of the substrate storing container are transmitted to the substrates via the back side substrate support portion and the lid body side substrate support portion, a result of which the substrates may be damaged. For this reason, it is demanded to suppress as much as possible the impact being transmitted to the substrates.

It is an object of the present invention to provide a substrate storing container that can suppress as much as possible the impact transmitted to a plurality of substrates stored in the substrate storing container during the transport of the substrate storing container.

Means for Solving the Problems

The present invention relates to a substrate storing container including: a container main body having formed inside thereof a substrate storing space that can store a plurality of substrates, and having formed at one end portion thereof a container main body opening portion that is in communication with the substrate storing space; a lid body that is removably attached to the container main body opening portion and can close the container main body opening portion; a lid body side substrate support portion which is arranged at a portion of the lid body that is a part opposing the substrate storing space when the container main body opening portion is closed by the lid body, and can support edge portions of the plurality of substrates when the container main body opening portion is closed by the lid body; and a back side substrate support portion that is arranged so as to form a pair with the lid body side substrate support portion inside the substrate storing space, that can support the edge portions of the plurality of substrates, and that supports the plurality of substrates in cooperation with the lid body side substrate support portion when the container main body opening portion is closed by the lid body, in which the lid body side substrate support portion allows flexibility to be exhibited and supports a substrate, in which, in a case in which a direction from one end portion of the container main body toward the other end portion with respect to the one end portion refers to a depth direction, a substrate being stored in the substrate storing space of the container main body in a state in which the container main body opening portion is closed by the lid body refers to a closed state substrate, a center of the closed state substrate refers to a closed time center, a virtual straight line passing though the closed time center and in parallel to the depth direction refers to a depth direction reference line, and a virtual straight line passing through the closed time center and perpendicular to the depth direction refers to a left/right direction reference line, when viewing the closed state substrate in the thickness direction, the back side substrate support portion is provided so as to form a pair interposing the depth direction reference line to support a substrate, and in which a center angle that the back side substrate support portion makes with respect to the left/right direction reference line toward the depth direction, when viewing the closed state substrate in a thickness direction, is at least 20° and no more than 55°.

Furthermore, it is preferable for the center angle being at least 35° and no more than 50°.

Furthermore, it is preferable for a diameter of a substrate being at least 450 mm.

Effects of the Invention

In accordance with the present invention, it is possible to provide a substrate storing container that can suppress as much as possible the impact transmitted to a plurality of substrates stored in the substrate storing container during the transport of the substrate storing container.

BRIEF DESCRIPTION OF THE DRAWINGS

FIG. 1 is a perspective view illustrating a substrate storing container according to the present embodiment;

FIG. 3B is an exploded perspective view illustrating a state in which substrates are stored in a substrate storing space of a container main body of a substrate storing container according to the present embodiment;

FIG. 4A is a plane cross-sectional view illustrating a substrate storing container according the present embodiment;

FIG. 4B is a plane cross-sectional view illustrating an aspect of a substrate being retained in a substrate storing container according to the present embodiment.

PREFERRED MODE FOR CARRYING OUT THE INVENTION

Figure 2A:
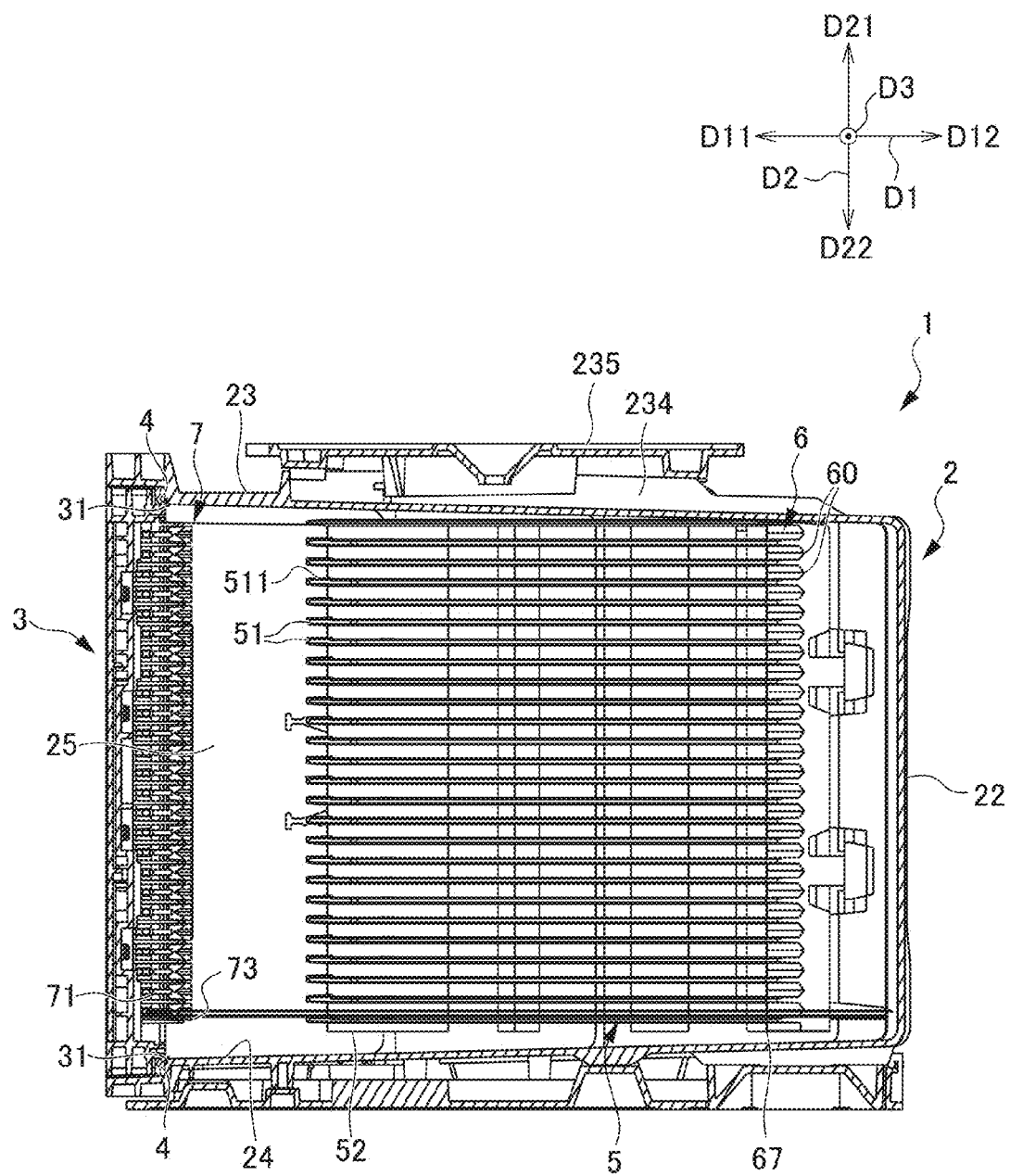
FIG. 2A is a vertical cross-sectional view illustrating a substrate storing container according to the present embodiment.
Figure 2B:
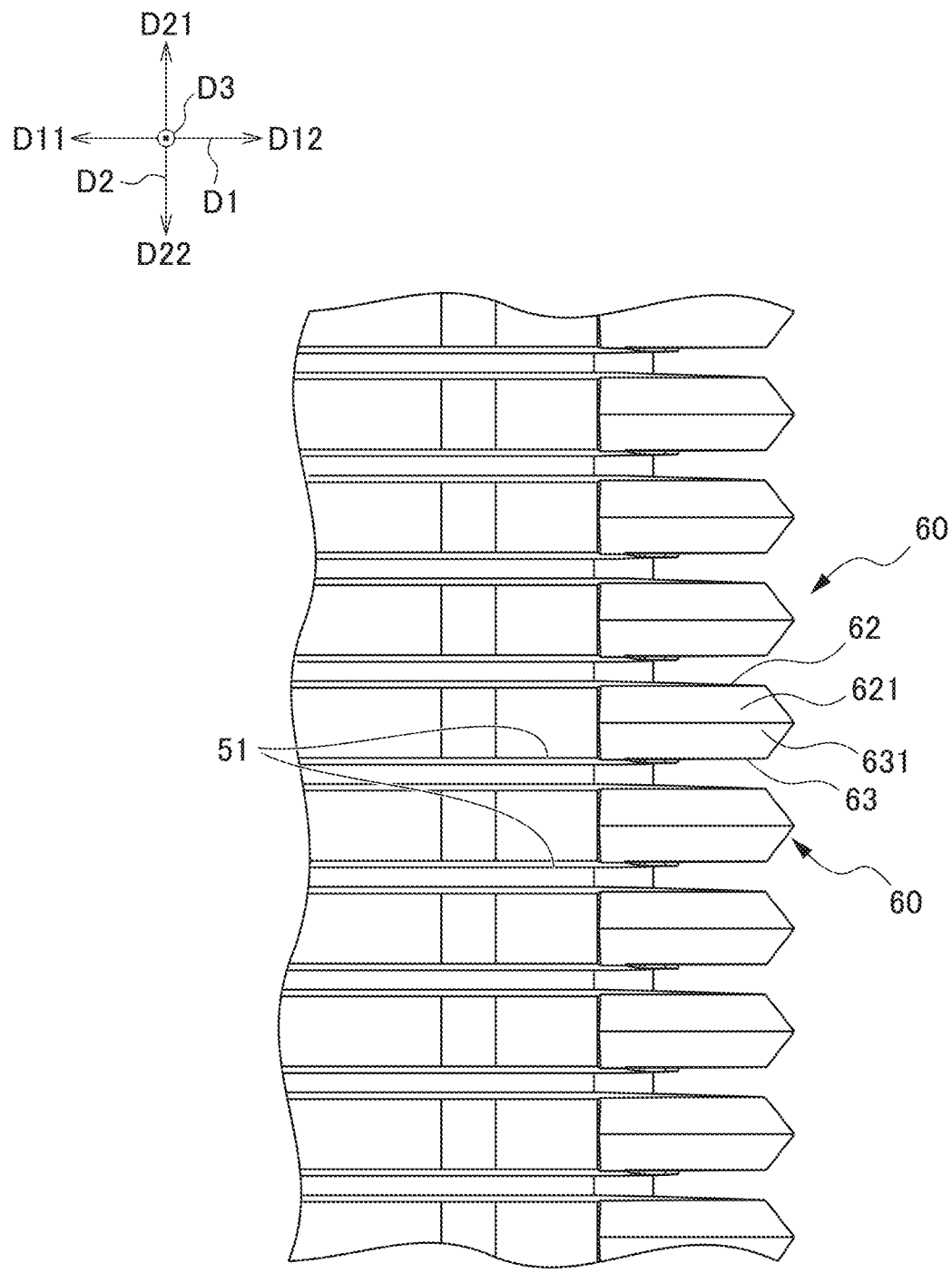
FIG. 2B is an enlarged cross-sectional side view illustrating a back side substrate support portion of a substrate storing container according to the present embodiment.
Figure 3A:
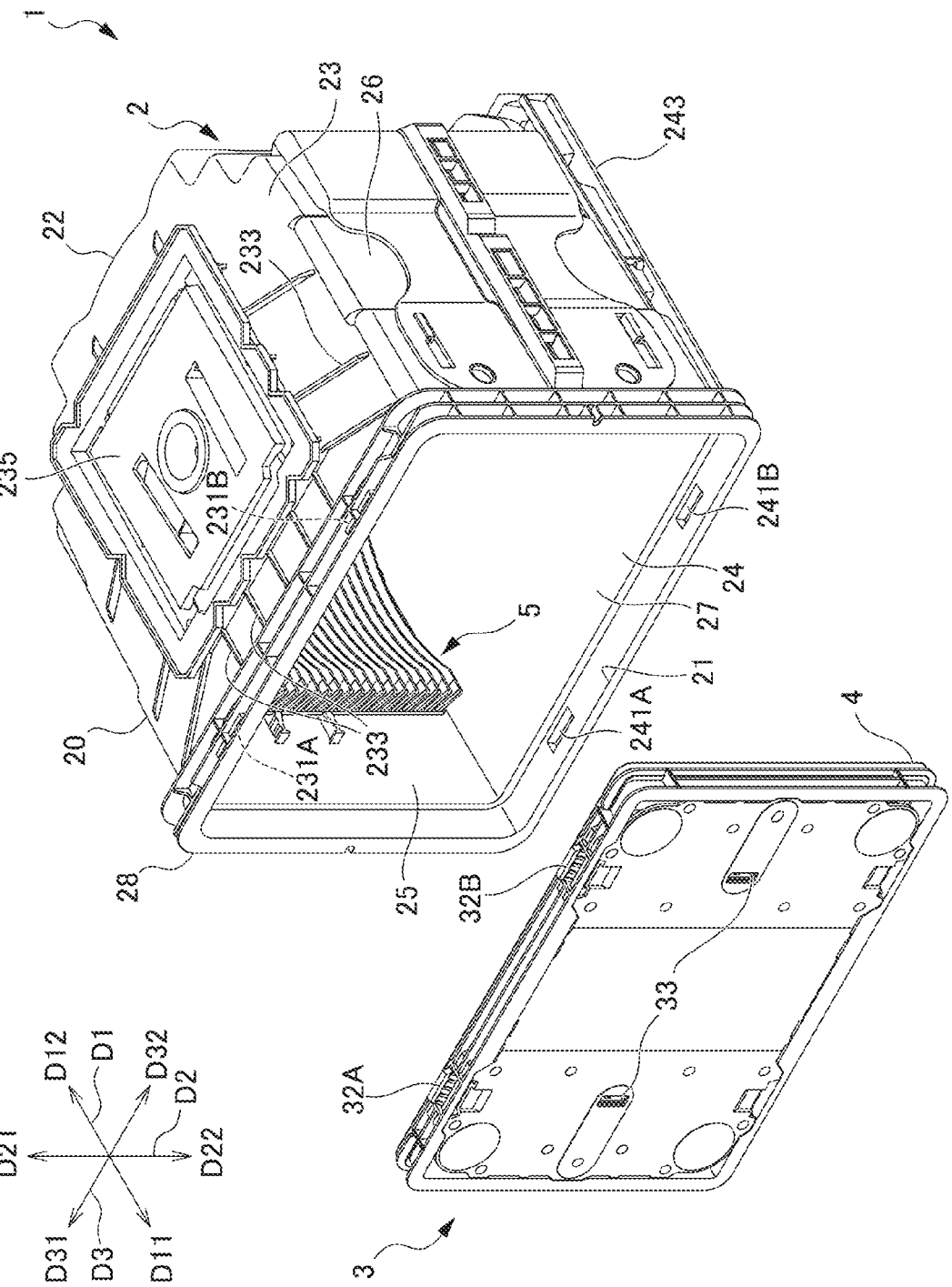
FIG. 3A is an exploded perspective view illustrating a state in which a lid of a substrate storing container according to the present embodiment is open.
Figure 5:
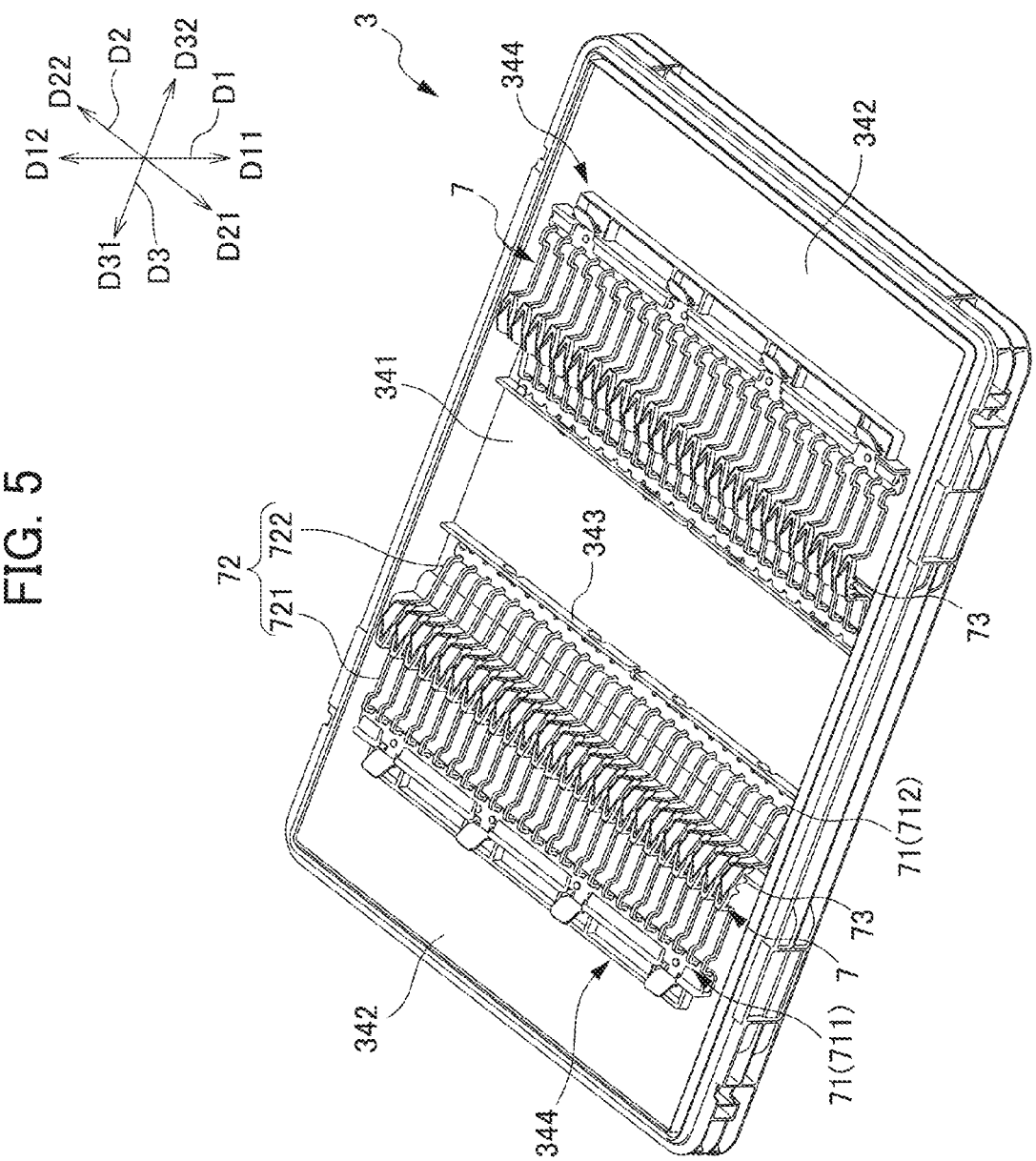
FIG. 5 is a rear perspective view illustrating a lid body of a substrate storing container according to the present embodiment.

In the follow, a substrate storing container according to an embodiment of the present invention is described with reference to the drawings. FIG. 1 is a perspective view illustrating a substrate storing container according to the present embodiment. FIG. 2A is a vertical cross-sectional view illustrating the substrate storing container according to the present embodiment. FIG. 2B is an enlarged cross-sectional side view illustrating a back side substrate support portion of the substrate storing container according to the present embodiment. FIG. 3A is an exploded perspective view illustrating a state in which a lid of the substrate storing container according to the present embodiment is open. FIG. 3B is an exploded perspective view illustrating a state in which substrates are stored in the substrate storing space of a container main body of the substrate storing container according to the present embodiment. FIG. 4A is a plane cross-sectional view illustrating the substrate storing container according the present embodiment. FIG. 4B is a plane cross-sectional view illustrating an aspect of a substrate being retained in the substrate storing container according to the present embodiment. FIG. 5 is a perspective view from behind illustrating a lid body of the substrate storing container according to the present embodiment.

Herein, for the purpose of illustration, the direction from a container main body 2 toward a lid body 3 (described later) (left direction in FIG. 2A) is defined as a forward direction D11 and the direction opposite to the direction D11 is defined as a backward direction D12 (depth direction). Furthermore, these directions are defined as a forward/backward direction D1. The backward direction (depth direction) D12 also refers to a direction from one end of the container main body 2 toward the other end relative to the one end. In addition, the direction from a lower wall 24 to an upper wall 23 (described later) (upper direction in FIG. 2A) is defined as an upper direction D21 and the direction opposite to the direction D21 is defined as a lower direction D22. Furthermore, these directions are defined as an upper/lower direction D2. The upper/lower direction D2 also refers to the thickness direction of the substrate W stored in the substrate storing container 1. Moreover, the direction from a second side wall 26 to a first side wall 25 (described later) (direction from the top face toward the back face of the plane of the page of FIG. 2A) is defined as a left direction D31 and the direction opposite to the direction D31 is defined as a right direction D32. Furthermore, these directions are defined as a left/right direction D3.

Furthermore, a substrate W (refer to FIG. 4B, etc.) stored in a substrate storing container 1 is a disk-like silicon wafer, glass wafer, sapphire wafer, etc., and is a thin member used for industrial use. The substrate W is, for example, a silicon wafer having a diameter of at least 450 mm. The substrate W in the present embodiment is a silicon wafer having a diameter of 450 mm.

As illustrated in FIGS. 1 to 3B, the substrate storing container 1 includes a container main body 2, a lid body 3, a sealing member 4, a substrate support plate-like portion 5, and a front retainer 7.

The container main body 2 has a tubular wall portion 20 with a container main body opening portion 21 formed at one end portion and the other end portion closed. A substrate storing space 27 is formed in the container main body 2. The substrate storing space 27 is formed to be surrounded by the wall portion 20. The substrate support plate-like portion 5 is disposed at a part that is a portion of the wall portion 20 and forming the substrate storing space 27. A plurality of substrates W can be stored in the substrate storing space 27 (refer to FIGS. 3B and 4B).

The substrate support plate-like portion 5 is provided at the wall portion 20 so as to form a pair in the substrate storing space 27. When the container main body opening portion 21 is not closed by the lid body 3, the substrate support plate-like portion 5 can support the edge portions of the plurality of substrates W in a state in which adjacent substrates W are arranged in parallel to be spaced apart by a predetermined interval. The back side substrate support portion 6 is integrally provided to the back side (side in the backward direction D12) of the substrate support plate-like portion 5. When the container main body opening portion 21 is closed by the lid body 3, the back side substrate support portion 6 can support rear portions of the edge portions of the plurality of substrates W.

It should be noted that the back side substrate support portion 6 may be configured so as to be separate from the substrate support plate-like portion 5.

The lid body 3 can be removably attached to the container main body opening portion 21 and can close the container main body opening portion 21. The front retainer 7 is a part of the lid body 3 and provided at a portion which faces the substrate storing space 27 when the container main body opening portion 21 is closed by the lid body 3. The front retainer 7 is provided so as to form a pair with the back side substrate support portion 6.

When the container main body opening portion 21 is closed by the lid body 3, the front retainer 7 can support front portions of the edge portions of the plurality of substrates W. When the container main body opening portion 21 is closed by the lid body 3, the front retainer 7 retains the plurality of substrates W in a state in which adjacent substrates W are arranged in parallel to be spaced apart by a predetermined interval by supporting the plurality of substrates W in cooperation with the back side substrate support portion 6. Each portion is described in detail in the following.

As illustrated in FIG. 3A, etc., the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure an opening circumferential portion 28 which forms the container main body opening 21 in a substantially rectangular shape.

The opening circumferential portion 28 is provided at one edge portion of the container main body 2, and the back wall 22 is located at the other edge portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. As described later, the substrate storing space 27 can store a maximum of twenty-five substrates W.

As illustrated in FIG. 3A, latch engagement concave portions 231A, 231B, 241A, and 241B, which are concave outwardly from the substrate storing space 27, are formed at portions of the upper wall 23 and the lower wall 24 which are proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, FIG. 2A, and FIG. 3A, ribs 233 and a flange fixing portion 234 are provided so as to be integrally formed with the upper wall 23 at an outer face of the upper wall 23. A plurality of the ribs 233 is provided which projects toward the upper direction D21 from the outer face of the upper wall 23. The ribs 233 include ribs extending in substantially the forward/backward direction D1 and ribs extending in substantially the left/right direction D3. A top flange 235 is fixed at the flange fixing portion 234. The top flange 235 is fixed at the upper wall 23 and becomes a member corresponding to a portion of the substrate storing container 1 from which it is hung to be suspended when suspending the substrate storing container 1 by AMHS (Automated Material Handling System), PGV (Person Guided Vehicle), etc.

As illustrated in FIG. 1, container main body leg portions 243 are provided at outer faces of the lower wall 24. As illustrated in FIG. 3A, etc., the container main body leg portions 243 are configured so as to be separate from the lower wall 24 at both left and right end edges of the lower wall 24 and extend in the forward/backward direction D1 along the left and right end edges of the lower wall 24. When the container main body 2 is placed on a horizontal flat face with the lower wall 24 as a lower side (side in the lower direction D22), the container main body leg portions 243 touch the flat face to stably support the container main body 2.

As illustrated in FIGS. 2A, 3A, and 4A the substrate support plate-like portions 5 are provided at the first side wall 25 and the second side wall 26, respectively, and are arranged in the substrate storing space 27 so as to form a pair in the left/right direction D3. More specifically, as illustrated in FIG. 2A, the substrate support plate-like portion 5 includes a plate portion 51, a plate portion support portion 52, and the back side substrate support portion 6. The plate portion 51, the plate portion support portion 52, and the back side substrate support portion 6 are configured to be integrally formed by resin. The plate portion 51 has a plate-like arc shape. Twenty-five of the plate portions 51 are provided at the first side wall 25 and the second side wall 26, respectively. The total number of the plate portions 51 is fifty. The adjacent plate portions 51 are arranged so as to be spaced apart in the upper/lower direction D2 by an interval of 10 mm to 12 mm in a parallel positional relationship. It should be noted that a member of substantially the same shape as the plate portion 51 is arranged above the plate 51 located at the top. This is a member that serves as a guide upon inserting for the substrate W to be inserted into the substrate storing space 27 to be located at the top.

Furthermore, as illustrated in FIG. 4A, the twenty-five plate portions 51 provided at the first side wall 25 and the twenty-five plate portions 51 provided at the second side wall 26 have a positional relationship opposite each other in the left/right direction D3. Furthermore, the fifty plate portions 51 and two members that serve as guides having substantially the same shape as the plate portion 51 have a positional relationship parallel to an inner face of the lower wall 24. As illustrated in FIG. 2A, a convex portion 511 is provided at an upper face of the plate portion 51. The substrate W supported by the plate portion 51 is only in contact with a projecting edge of the convex portion 511, and does not contact with the face of the plate portion 51.

As illustrated in FIG. 2A, the plate portion support portion 52 is configured with a member extending in the upper/lower direction D2. The twenty-five plate portions 51 provided at the first side wall 25 are connected to the plate portion support portion 52 provided at the first side wall 25. Similarly, the twenty-five plate portions 51 provided at the second side wall 26 are connected to the plate portion support portion 52 provided at the second side wall 26.

The plate portion support portion 52 includes first side wall locking portions 53. The first side wall locking portions 53, 53 can be locked with lateral plate locking portions 251, 261 provided respectively at the first side wall 25 and the second side wall 26. With the substrate support plate-like portion 5 of such a configuration, it is possible to support the edge portions of the plurality of substrates W in a state in which the adjacent substrates W among the plurality of substrates W are arranged to be spaced apart by a predetermined interval in a parallel positional relationship.

Here, for the purpose of explanation, the substrate W being stored in the substrate storing space 27 of the container main body 2 in a state in which the container main body opening portion 21 is closed by the lid body 3 is referred to as "closed state substrate W1" (refer to FIG. 4B). The substrate W which is stored in the substrate storing space 27 of the container main body 2 in a state in which the container main body opening portion 21 is not closed by the lid body 3 is referred to as "non closed state substrate W2" (refer to FIG. 3B).

Furthermore, as illustrated in FIG. 4B, the center of the closed state substrate W1 is referred to as "closed time center C1". It should be noted that, when viewing the substrate W in the thickness direction D2, the closed time center C1 is generally displaced from the center of a non closed state substrate W2 (not illustrated) (more specifically, displaced in the forward/backward direction D12). A virtual linear line passing through the closed time center C1 and in parallel with the backward direction (depth direction) D12 is referred to as "depth direction reference line CL1". A virtual linear line passing through the closed time center C1 and perpendicular to the backward direction (depth direction) D12 is referred to as "left/right direction reference line CL2".

As illustrated in FIG. 4B, when viewing the closed state substrate W1 in the thickness direction D2, the back side substrate support portions 6 are provided so as to form a pair interposing the depth direction reference line CL1. As illustrated in FIG. 2A, the back side substrate support portion 6 includes a wall portion substrate support portion 60 and a side wall rear portion locking portion 67. The side wall rear portion locking portions 67, 67 can be locked with back side substrate support portion locking portions 252, 262 provided at the first side wall 25 and the second side wall 26, respectively.

As the first side wall locking portions 53, 53 are locked with the lateral plate locking portions 251, 261 and the side wall rear portion locking portions 67, 67 are locked with the back side substrate support portion locking portions 252, 262, the substrate support plate-like portion 5 is fixed by the first side wall 25 and the second side wall 26, respectively.

The wall portion substrate support portion 60 of the back side substrate support portion 6 supports the substrate W without substantially allowing flexibility to be exhibited. The phrase "without substantially allowing flexibility to be exhibited" indicates that the material and structure of the wall portion substrate support portion 60 are devised so that flexibility is not intentionally allowed to be exhibited.

It should be noted that it is also possible to configure the back side substrate support portion 6 so as to support the substrate W in a state allowing flexibility to be exhibited.

The wall portion substrate support portions 60 are provided in a number, i.e. twenty-five, so as to respectively correspond to each one of the substrates W that can be stored in the substrate storing space 27. The wall portion substrate support portions 60 provided at the first side wall 25 and the second side wall 26 have a positional relationship that forms a pair with a front retainer 7 described later in the forward/backward direction D1.

As illustrated in FIG. 2B, the wall portion substrate support portion 60 includes a support portion upper portion 62 having a first contact face 621 and a support portion upper portion 63 having a second contact face 631.

As illustrated in FIG. 4B, when the substrate W is stored in the substrate storing space 27, and the substrate W (the closed state substrate W1) is supported by the back side substrate support portion 6 and the front retainer 7 by the lid body 3 being shut (closed), an end edge of an edge portion of an upper face of the substrate W can abut the first contact face 621 and an end edge of an edge portion of a lower face of the substrate W can abut the second contact face 631.

As illustrated in FIG. 3A, the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. As illustrated in FIG. 4A, at a circumferential edge portion of the lid body 3, a sealing member fitting groove 31 is formed along the circumferential edge portion of the lid body 3. A ring-like sealing member 4 that may be made of elastically deformable POE (polyoxyethylene) or PEE, or alternatively made of various types of thermoplastic elastomer such as polyester and polyolefin, fluorine containing rubber, silicon rubber, etc., is fit into the sealing member fitting groove 31. The sealing member 4 is arranged so as to go around the circumferential edge portion of the lid body 3.

The sealing member 4 can abut the opening circumferential portion 28, which is a part of the container main body 2 that forms the container main body opening portion 21. The sealing member 4 is brought into close contact abutting with the opening circumferential portion 28 to be interposed between the opening circumferential portion 28 and the lid body 3, whereby it is possible to close the container main body opening portion 21 by the lid body 3 in an air tight state.

Furthermore, by the lid body 3 being removed from the opening circumferential portion 28, it is possible to load or unload the substrates W relative to the substrate storing space 27 in the container main body 2.

A latching mechanism is provided at the lid body 3. The latching mechanism is provided in the vicinity of both left and right end portions of the lid body 3. As illustrated in FIGS. 3A and 3B, the latching mechanism includes two upper side latch portions 32A, 32B which can project from the upper side of the lid body 3 in the upper direction D21 and two lower side latch portions (not illustrated) that can project from the lower side of the lid body 3 in the lower direction D22. The two upper side latch portions 32A, 32B are arranged in the vicinity of both left and right ends of the upper side of the lid body 3 and the two lower side latch portions are arranged in the vicinity of both left and right ends of the lower side of the lid body 3.

As illustrated in FIG. 3A, an operation portion 33 is provided at an outer face of the lid body 3. By operating the operation portion 33 from the front side of the lid body 3, it is possible to cause the upper side latch portions 32A, 32B, and the lower side latch portions to project from the upper side and the lower side of the lid body 3 as well as possible to make a state not projecting from the upper side and the lower side of the lid body 3. By the upper side latch portions 32A, 32B projecting from the upper side of the lid body 3 in the upper direction D21 to engage with the latch engagement concave portions 231A and 231B of the container main body 2 and the lower side latch portions projecting from the lower side of the lid body 3 in the lower direction D22 to engage with the latch engagement concave portions 241A and 241B of the container main body 2, the lid body 3 is fixed to the opening circumferential portion 28 of the container main body 2.

As illustrated in FIGS. 4A and 5, a lid body leg portion fixing concave portion 341 that is concave in the forward direction D11 of the container main body 2 is formed at a part of an inner face of the lid body 3 that is a portion closing the container main body opening portion 21. The lid body leg portion fixing concave portion 341 has a width of approximately one third the width of the lid body 3 in the left/right direction D3 at the center location of the lid body 3 in the left/right direction D3, and is formed from the vicinity of an upper end portion up to the vicinity of a lower end portion of the lid body 3 in the upper/lower direction D2. The upper end and the lower end of the lid body leg portion fixing concave portion 341 is formed by the edge portion of the lid body 3. Portions that are parts of an inner face of the lid body 3 at the both sides of the lid body leg portion fixing concave portion 341 in the left/right direction D3 are configured by inner face left/right end portion flat faces 342.

The lid body 3 has a symmetrical configuration about a virtual line extending vertically at the center of the lid body 3 in the left/right direction D3. For this reason, a configuration of a portion on the right side (the left side shown in FIG. 5) is mainly described in detail, and detailed explanations for a portion on the left side (the right side shown in FIG. 5) are omitted here.

Since the lid body 3 has a symmetrical configuration as described above, two front retainers 7 fixed to the lid body 3 are provided symmetrically about the virtual line. In other words, a front retainer substrate receiving portion 73 serving as other lid body side substrate support portion described later is arranged so as to form a pair in the left/right direction D3. A front retainer leg portion 72 connected to one front retainer substrate receiving portion 73 among the front retainer substrate receiving portions 73 forming a pair, and a front retainer leg portion 72 connected to the other front retainer substrate receiving portion 73 among the front retainer substrate receiving portions 73 forming a pair are configured separately.

As illustrated in FIG. 5, a pair of the front retainer locking plates 343 is provided in the vicinity of both ends of the lid body leg portion fixing concave portion 341 in the left/right direction D3. The pair of the front retainer locking plates 343 extends in the upper/lower direction D2. Furthermore, a front retainer locking portion 344 is provided respectively at a center portion of each of the inner face left/right end portion flat faces 342 in the left/right direction D3.

As illustrated in FIG. 5, the front retainer 7 is provided at a location opposing an inner face of the lid body 3, and extends from the front retainer locking plate portion 343 on the left side (side in the left direction D31) to the front retainer locking plate portion 344 on the left side. The front retainer 7 includes a pair of vertical frame bodies 71 extending in parallel in the upper/lower direction D2, a pair of front retainer leg portions 72, and a front retainer substrate receiving portion 73. The pair of vertical frame bodies 71, the front retainer leg portion 72, and the front retainer substrate receiving portion 73 are integrally formed with resin and connected to each other. The front retainer substrate receiving portion 73 of the front retainer 7 can allow flexibility to be exhibited and support the substrate W.

As illustrated in FIG. 5, the front retainer substrate receiving portion 73 is not arranged in the lid body leg portion fixing concave portion 341, but rather arranged more toward the back side (side in the backward direction D12) than the lid body leg portion fixing concave portion 341 in the depth direction (backward direction D12).

The left end portion, which is one end portion of the front retainer substrate receiving portion 73 is connected to the right end portion of one front retainer leg portion 721 among the pair of front retainer leg portions 72. The right end portion, which is the other end portion of the front retainer substrate receiving portion 73, is connected to the left end portion of the other front retainer leg portion 722 among the pair of front retainer leg portions 72.

The front retainer substrate receiving portion 73 and the front retainer leg portions 72 as a pair are provided such that twenty-five pieces thereof are arranged in parallel in the upper/lower direction D2.

One vertical frame body 71 (711) is locked with the front retainer locking portion 344. When the one vertical frame body 711 is locked with the front retainer locking portion 344 and the other vertical frame body 71 (712) is locked with the front retainer locking portion 343, the front retainer 7 is fixed to the lid body 3.

As illustrated in FIGS. 4A and 4B, when viewing the closed state substrate W1 in the thickness direction (upper/lower direction D2), the front retainer substrate receiving portions 73 serving as lid body side substrate support portions are provided so as to form a pair interposing the depth direction reference line CL1. The center angle α formed by the wall portion substrate support portion 60 of the back side substrate support portion 6 with respect to the left/right direction reference line CL2 toward the backward direction D12 (depth direction), when viewing the closed state substrate W1 in the thickness direction (upper/lower direction D2), is at least 20° and no more than 55°. The center angle α is preferably at least 35° and no more than 50°.

The center angle β that the front retainer substrate receiving portion 73 serving as a lid body side substrate support portion makes with respect to the left/right direction reference line CL2 toward the forward direction D11, when viewing the closed state substrate W1 in the thickness direction (upper/lower direction D2), is at least 60° and no more than 85°.

The reference position of the back side substrate support portion 6 (wall portion substrate support portion 60) in a case of defining a center angle α is as follows. When viewing the closed state substrate W1 in the thickness direction D2, the reference position of the back side substrate support portion 6 (the wall portion substrate support portion 60) is established as a portion which substantially contributes to support the closed state substrate W1 at the back side substrate support portion 6 (the wall portion substrate support portion 60) (also referred to as "support contribution portion"). In a case in which the support contribution portion has a length along a circumferential direction of the closed state substrate W1, the center position of the length is set as a reference position. In a case in which a plurality of the back side substrate support portions 6 (the wall portion substrate support portion 60) is provided at one side with respect to the depth direction reference line CL1 for one closed state substrate W1, an average position of reference position for each of the back side substrate support portions 6 (the wall portion substrate support portions 60) is set as a reference position.

A reference position of the center angle β at the front retainer substrate receiving portion 73 serving as a lid body side substrate support portion is also defined similarly to the center angle α at the abovementioned back side substrate support portion 6 (the wall portion substrate support portion 60).

The following effect can be obtained in accordance with the substrate storing container 1 according to the embodiment with the abovementioned configuration.

As mentioned above, in the present embodiment, the front retainer substrate receiving portion 73 serving as a lid body side substrate support portion allows flexibility to be exhibited and supports the substrate W, and when viewing the closed state substrate W1 in the thickness direction (the upper/lower direction D2), the wall portion substrate support portions 60 of the back side substrate support portions 6 are provided so as to form a pair interposing the depth direction reference line CL1 and support the substrate W, and when viewing the closed state substrate W1 in the thickness direction, the center angle α that the wall portion substrate support portion 60 of the back side substrate support portion 6 makes with respect to the left/right direction reference line CL2 toward the depth direction D12 (backward direction) is at least 20° and no more than 55°.

For this reason, when an impact is imparted by dropping the substrate storing container 1 storing a plurality of the substrates W such as semiconductor wafers, arranged therein in a parallel manner, or by shaking the substrate storing container 1, it is possible to appropriately support the substrates W by absorbing the impact by means of the front retainer substrate receiving portion 73, which allows flexibility to be exhibited and supports the substrates, and the wall portion substrate support portion 60 arranged in a predetermined circumferential direction. For this reason, it is possible to suppress as much as possible impacts transmitted to the plurality of substrates W stored in the substrate storing container 1 during the transport of the substrate storing container 1. Accordingly, it is possible to suppress the substrates W stored in the substrate storing container 1 from being damaged.

In particular, compared to a semiconductor wafer having a diameter of 300 mm, in a case in which the substrate W stored is a semiconductor wafer having a diameter of at least 450 mm for which the ratio of the thickness to the diameter (area) becomes smaller so that the impact resistance (an extent of being not fragile to impact) declines, the support structure of the substrate W according to the present invention is effective.

The present invention is not limited to the abovementioned embodiments, and modifications thereto within the technical scope claimed in the claims are possible.

For example, the shapes of the container main body and the lid body and the number and dimensions of substrates that can be stored in the container main body are not limited to the shape of the container main body 2 and the lid body 3 and the number and dimensions of the substrates W that can be stored in the container main body 2 according to the present embodiments.

EXAMPLES

Hereinafter, the present invention is explained in further detail according to the Example. It should be noted that the present invention is not limited thereto.

Impact resistance (level of difficulty in breaking by impact) of the substrate W stored in the substrate storing container 1 was evaluated using each example and comparative example described later in cases differing in the center angle α that the back side substrate support portion 6 makes with respect to the left/right direction reference line CL2 toward the depth direction D12, when viewing the closed state substrate W1 in the thickness direction D2.

The common conditions in each example and comparative example are as follows.
Substrate W: silicon wafer
Diameter of substrate W: 450 mm
Thickness of substrate W: 925 μm
Stored number of Substrates W: 25
Center angle β that the lid body side substrate support portion 73 makes with respect to the left/right direction reference line CL2 toward the forward direction D11 when viewing the closed state substrate W1 in the thickness direction D2: 65°

In each example and comparative example, the center angle α that the back side substrate support portion 6 makes with respect to the left/right direction reference line CL2 toward the depth direction D12, when viewing the closed state substrate W1 in the thickness direction D2, is as shown in Table 1 below.

TABLE 1

| | CENTER ANGLE α FORMED BY REAR SIDE SUBSTRATE SUPPORT PORTION 6 | OCCURRENCE OF CRACK |
| --- | --- | --- |
| COMPARATIVE EXAMPLE 1 | 30° | YES |
| EXAMPLE 1 | 35° | NO |
| EXAMPLE 2 | 40° | NO |
| EXAMPLE 3 | 45° | NO |
| EXAMPLE 4 | 50° | NO |
| EXAMPLE 5 | 55° | NO |
| COMPARATIVE EXAMPLE 2 | 60° | YES |

Evaluation Direction

Dropping on the floor surface the substrate storing container 1 with the abovementioned conditions in a state of arranging the planar direction of the substrate W in a horizontal direction, from a state in which a lower face (an outer face of the lower wall 24) of the substrate storing container 1 is arranged 90 cm above the floor surface. The floor surface is made of concrete. After dropping, if a crack occurs for one or more substrates W stored in the substrate storing container 1, the occurrence of a crack is evaluated as "YES", and if no cracks occur for any of the substrates W stored in the substrate storing container 1, the occurrence of crack is evaluated as "NO".

The evaluation results are shown in Table 1.

According to the evaluation results shown in Table 1, it is understood that the impact resistance (level of difficulty in breaking by impact) is high so long as the center angle α that the back side substrate support 6 makes is within a predetermined range.

EXPLANATION OF REFERENCE NUMERALS 1 substrate storing container
2 container main body
3 lid body
4 sealing member
5 substrate support plate-like portion
6 back side substrate support portion
7 front retainer
20 wall portion
21 container main body opening portion
27 substrate storing space
28 opening circumferential portion
60 wall portion substrate support portion
73 front retainer substrate receiving portion (lid body side substrate support portion)
C1 closed time center
CL1 depth direction reference line
CL2 left/right direction reference line
D12 backward direction (depth direction)
D2 upper/lower direction (depth direction)
W substrate W1 closed state substrate
α center angle
β center angle

The invention claimed is:

1. A substrate storing container comprising:
a container main body having formed inside thereof a substrate storing space that can store a plurality of substrates, and having formed at a first end portion thereof a container main body opening portion that is in communication with the substrate storing space;
a lid body that is removably attached to the container main body opening portion and can close the container main body opening portion;
a lid body side substrate support portion which is arranged at a portion of the lid body that is a part opposing the substrate storing space when the container main body opening portion is closed by the lid body, and supports only two edge portions of each of the plurality of substrates when the container main body opening portion is closed by the lid body; and
a back side substrate support portion that is arranged so as to form a pair with the lid body side substrate support portion inside the substrate storing space, that can support the edge portions of the plurality of substrates, and that supports the plurality of substrates in cooperation with the lid body side substrate support portion when the container main body opening portion is closed by the lid body,
wherein the lid body side substrate support portion allows flexibility to be exhibited and supports a substrate,
wherein, in a case in which a direction from the first end portion of the container main body toward a second end portion opposite from the first end portion refers to a depth direction, a direction from the second end portion toward the first end portion of the container main body is defined as a forward direction, a substrate being stored in the substrate storing space of the container main body in a state in which the container main body opening portion is closed by the lid body refers to a closed state substrate, a center of the closed state substrate refers to a closed time center, a virtual straight line passing though the closed time center and in parallel to the depth direction refers to a depth direction reference line, and a virtual straight line passing through the closed time center and perpendicular to the depth direction refers to a left/right direction reference line, when viewing the closed state substrate in a thickness direction, the back side substrate support portion includes paired sections, and
wherein a first center angle formed by a line connecting an end of the back side substrate support portion on a side of an other end portion of the container main body and the closed time center and the left/right direction reference line, when viewing the closed state substrate in the thickness direction, is at least 20° and no more than 55°, and
a second center angle formed by a line connecting one of the lid body side substrate support portions and the closed time center and the left/right direction reference line, when viewing the closed state substrate in the thickness direction, is at least 60° and no more than 85°.

2. The substrate storing container according to claim 1, wherein the first center angle is at least 35° and no more than 50°.

3. The substrate storing container according to claim 1, wherein a diameter of a substrate to be stored in the substrate storing container is at least 450 mm.

4. The substrate storing container according to claim 2, wherein a diameter of a substrate to be stored in the substrate storing container is at least 450 mm.

* * * * *